(12) United States Patent
Melde et al.

(10) Patent No.: US 9,898,572 B2
(45) Date of Patent: Feb. 20, 2018

(54) METAL LINE LAYOUT BASED ON LINE SHIFTING

(71) Applicant: GLOBALFOUNDRIES Inc., Grand Cayman (KY)

(72) Inventors: Thomas Melde, Dresden (DE); Matthias U. Lehr, Dresden (DE); Thomas Herrmann, Radebeul (DE); Jens Hassmann, Dresden (DE); Moritz Andreas Meyer, Dresden (DE); Rakesh Kumar Kuncha, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 77 days.

(21) Appl. No.: 15/045,466

(22) Filed: Feb. 17, 2016

(65) Prior Publication Data
US 2017/0235867 A1 Aug. 17, 2017

(51) Int. Cl.
*G06F 17/50* (2006.01)

(52) U.S. Cl.
CPC ............... *G06F 17/5077* (2013.01)

(58) Field of Classification Search
CPC ..... G03F 1/30; G03F 1/70; H01L 2924/0002; H01L 2924/00; H01L 23/522; H01L 23/5256; H01L 27/101
See application file for complete search history.

(56) References Cited

U.S. PATENT DOCUMENTS

| | | | | |
|---|---|---|---|---|
| 6,684,382 | B2 * | 1/2004 | Liu | ............ G03F 1/36 716/52 |
| 2002/0195709 | A1 * | 12/2002 | Sandhu | ............ H01L 21/2885 257/750 |
| 2003/0068566 | A1 * | 4/2003 | Pierrat | ............ G03F 1/70 430/5 |
| 2009/0246648 | A1 * | 10/2009 | Yen | ............ G03F 1/36 430/5 |
| 2011/0107280 | A1 * | 5/2011 | Liu | ............ G03F 1/144 716/53 |

* cited by examiner

*Primary Examiner* — Vuthe Siek
(74) *Attorney, Agent, or Firm* — Amerson Law Firm, PLLC

(57) ABSTRACT

A method of Back-End-Of-Line processing of a semiconductor device is provided including providing a layout for metal lines of a metallization layer of the semiconductor device, determining a semi-isolated metal line in the provided layout and shifting at least a portion of the determined semi-isolated metal line.

20 Claims, 14 Drawing Sheets

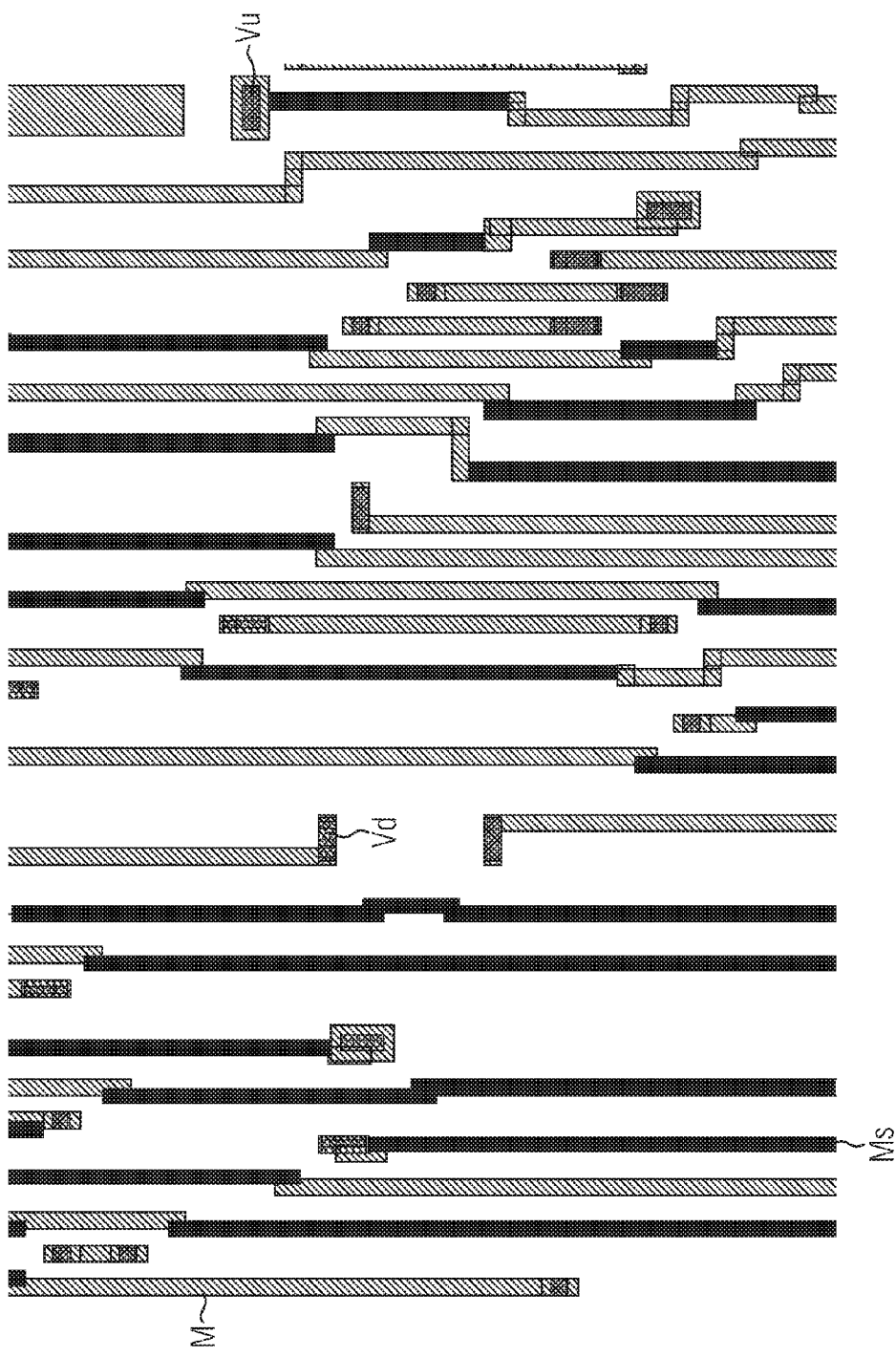

METAL LINE LAYOUT BASED ON LINE SHIFTING

BACKGROUND OF THE INVENTION

1. Field of the Invention

Generally, the present disclosure relates to the field of integrated circuits and, in particular, to the formation of metal lines in BEOL processing.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, complementary MOS (CMOS) technology, millions of N-channel transistors and P-channel transistors are formed on a substrate including a crystalline semiconductor layer.

The semiconductor manufacturing process typically includes two major components, namely the Front-End-of-Line (FEOL), which includes the multilayer process of forming semiconductor devices (transistors, etc.) on a semiconductor substrate, and the Back-End-Of-Line (BEOL), which includes the metallization after the semiconductor devices have been formed. Proper electrical connection of the semiconductor devices is accomplished by multilayer metallization. Each metallization layer consists of a grid of metal lines sandwiched between one or more dielectric layers for electrical integrity. In fact, manufacturing processes can involve multiple metallization layers. For instance, in forming a copper-based metallization layer, the so-called inlaid or damascene technique is presently a preferred manufacturing method to create metal lines and via. To this end, a dielectric layer, typically comprised of a low-k dielectric, is deposited and patterned so as to receive trenches and vias in accordance with design requirements.

The formation of IC structures on a wafer is usually facilitated by lithographic processes used to transfer a pattern of a reticle (mask, both terms are used interchangeably herein) to a wafer. Patterns can be formed from a photoresist layer disposed on the wafer by passing light energy through a mask having an arrangement to image the desired pattern onto the photoresist layer. As a result, the pattern is transferred to the photoresist layer. In areas where the photoresist is sufficiently exposed, and after a development cycle, the photoresist material becomes soluble such that it can be removed in order to selectively expose an underlying layer (e.g., a semiconductor layer, a metal or metal-containing layer, a dielectric layer, a hard mask layer, etc.). Portions of the photoresist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photoresist layer can be removed. As an alternative to the described positive tone resist process, the complementary negative tone resist process can be used.

However, at least starting with the 45 nm node, the minimum feature size on the mask has reached sub-wavelength dimensions. Consequently, the so-called optical proximity effect caused by non-uniformity of energy intensity due to optical diffraction during the exposure process occurs. Therefore, optical proximity correction is used to solve pattern deformation caused by the optical proximity effect. The optical proximity effect, due to variations in focus and exposure of the lithography process, leads to parts of the design layout resulting in hot spots in the form of bridging, necking, line-end shortening, etc. Due to the formation of hot spots, printed circuits may fail certain specifications thereby reducing the production yield.

Optical proximity correction (OPC) has been employed in order to reduce pattern deformation (hot spot formation) caused by the optical proximity effect. OPC is the process of correcting the layout of target patterns to be transferred onto a wafer using knowledge of the optical proximity effect. Generally, current OPC techniques involve running a computer simulation that takes an initial data set having information relating to the desired pattern and manipulates the data set to arrive at a corrected data set in an attempt to compensate for the above-mentioned concerns. A reticle can then be made in accordance with the corrected data set. The formed reticle may include "hammerheads" or "serifs" added to line ends to effectively anchor them in place and provide reduced pull back. Moreover, completely independent and non-resolvable assist features may be added to the mask that are intended to modify the aerial image of a nearby main feature to enhance the printability and process tolerance of that main feature. Such features may be provided in the form of scattering bars.

However, due to the ongoing reduction of critical dimensions and semiconductor device features, metal line formation, in particular, on the basis of copper materials in advanced semiconductor manufacturing, in particular, complementary metal-oxide-semiconductor (CMOS) manufacturing, is a critical issue in dense pattern regions. Despite the recent advances in OPC technology, it is still very difficult to form dense metal line structures with very small interspaces between individual metal lines without causing random defects of the formed integrated circuit. Particularly, the formation of copper metal lines poses problems due to the limited ability to fill copper into critical minimum features (trenches, for example). Moreover, densely packed metal lines undesirably show increased resistances and capacitive couplings. In addition, high series resistance of the metal lines, due to design restriction in view of the line width, may result in high current densities, which may lead to degraded performance and reduced reliability due to increased electromigration, i.e., a current induced material flow caused by high current densities.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the manufacture of integrated circuits and semiconductor devices comprising BEOL processing including the formation of metal lines. In view of the situation described above, the present disclosure provides means for increasing the metal line pitches (distances) based on a properly designed layout comprising metal line shifting (displacement) of identified semi-isolated metal lines.

A method of Back-End-Of-Line (BEOL) processing of a semiconductor device (an integrated circuit, for example) is provided including providing a layout for metal lines of a metallization layer of the semiconductor device, determining a semi-isolated metal line in the provided layout and shifting at least a portion of the determined semi-isolated metal line. The metallization layer may be the second, third or higher metallization layer of the semiconductor device. A metal line is determined to be a semi-isolated metal line if it is separated from a neighbored portion of another metal line by a distance exceeding a predetermined threshold, for example, twice the width of the metal line or more. The at least a portion of the metal line is shifted (displaced) into available (unoccupied) space provided by the layout before the shifting process in order to increase the distance of the shifted portion from the neighbored metal line.

Furthermore, a method of generating a layout for metal lines of a metallization layer of a semiconductor device is provided. The method of generating the layout includes providing a first layout comprising metal lines of the metallization layer, determining semi-isolated metal lines (defined as stated above) of the metal lines of the first layout and shifting at least portions of the determined semi-isolated metal lines into available (free) space of the first layout to generate a second layout such that the shifted portions are located farther away from closest neighbored metal lines in the second layout as compared to the first layout. For example, if it is determined that a first metal line of the first layout that is neighbored to a second metal line as the closest neighbor of the first metal line is a semi-isolated metal line, it is located farther away from the second metal line in the second layout than in the first layout. In particular, the first metal line is determined to be a semi-isolated metal line if it is spaced apart from a neighbored third metal line by at least a predetermined distance. After the shifting process, the first metal line may be located closer to the third metal line in the second layout as compared to the first layout.

The above-described layouts can be used for designing and producing a mask that can be used for the formation of a metallization layer of a semiconductor device.

BRIEF DESCRIPTION OF THE DRAWINGS

The disclosure may be understood by reference to the following description taken in conjunction with the accompanying drawings, in which like reference numerals identify like elements, and in which:

FIGS. 1a and 1b illustrate an example of a layout based on metal line shifting;

Figure 1A:
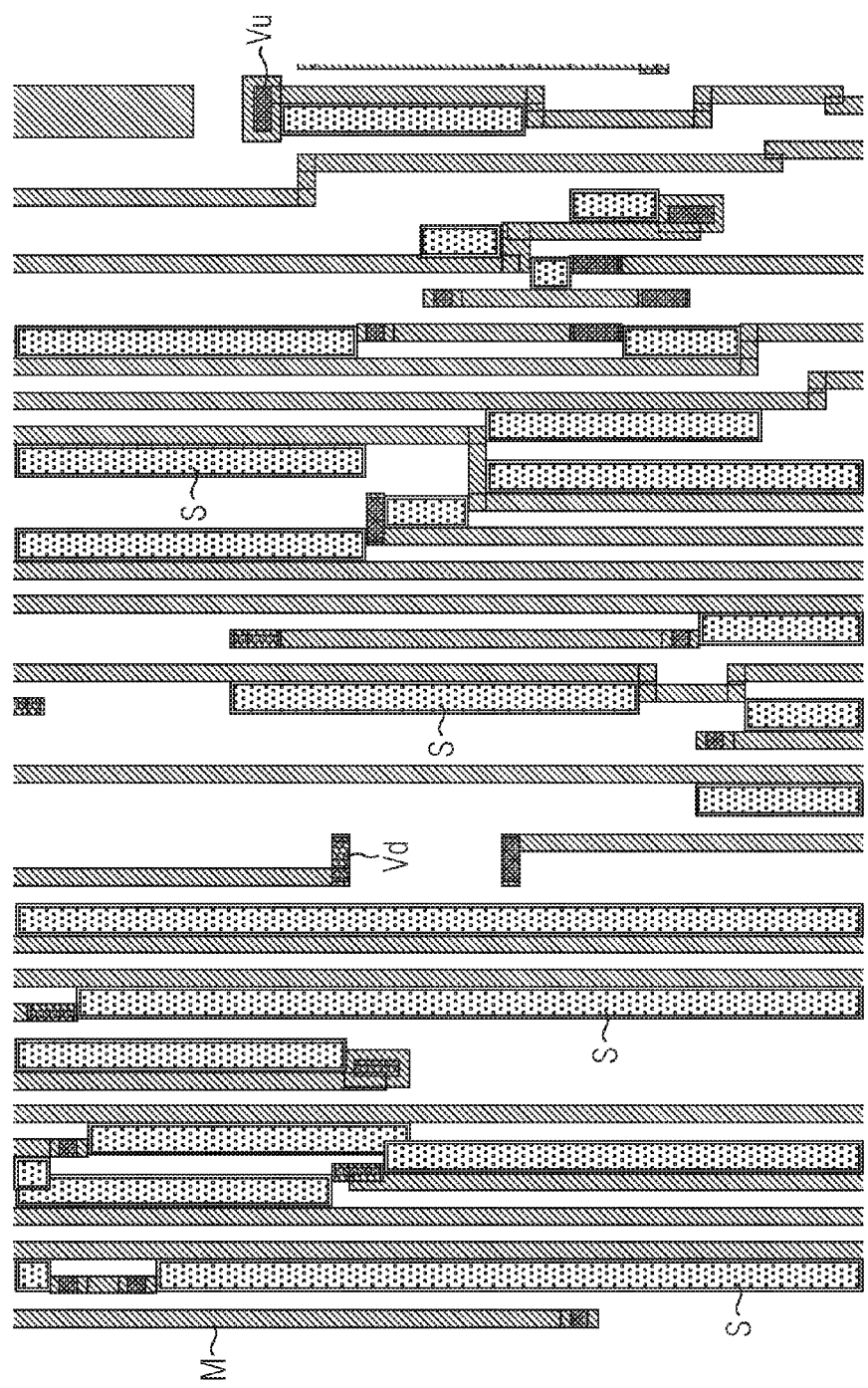

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques for integrated circuits are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein can be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure, generally, provides techniques of manufacturing integrated circuits wherein, during the BEOL processing, metal line structures (layouts) may be formed where individual metal lines may be formed with increased distances from each other as compared to the art.

FIG. 1a shows a top view of an exemplary metal line layout of a second, third or higher metallization layer, for example, wherein the metal line layout might be provided by a standard layout process as a starting point for an example of the herein disclosed method. At least some of the metal lines M (shown hatched to be formed according to the layouts shown in FIGS. 1a and 1b as well as FIGS. 2a-2d) may be formed according to the so-called "via first/trench last" approach, in which openings for vias are formed first in an interlayer dielectric material and subsequently trench openings are patterned, or according to the so-called "trench first/via last" approach, in which the trenches are formed first and thereafter the via openings are provided on the basis of sophisticated lithography and etch techniques. During the "via first/trench last" approach, the surface topography resulting from the patterning of the interlayer dielectric material may be planarized prior to actually patterning the trench openings on the basis of an appropriate material, such as a polymer material, a photoresist material, etc.

Figure 5:
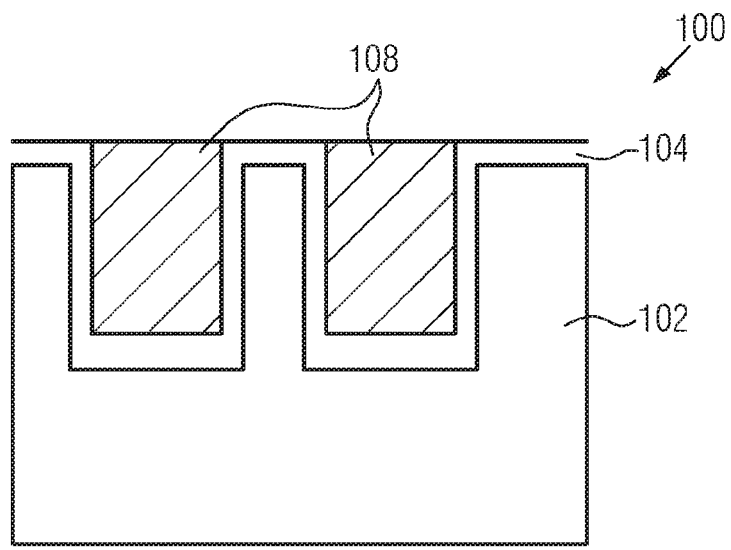
FIG. 5 shows a cross-sectional view of a metallization layer comprising a metal line.
Figure 6:
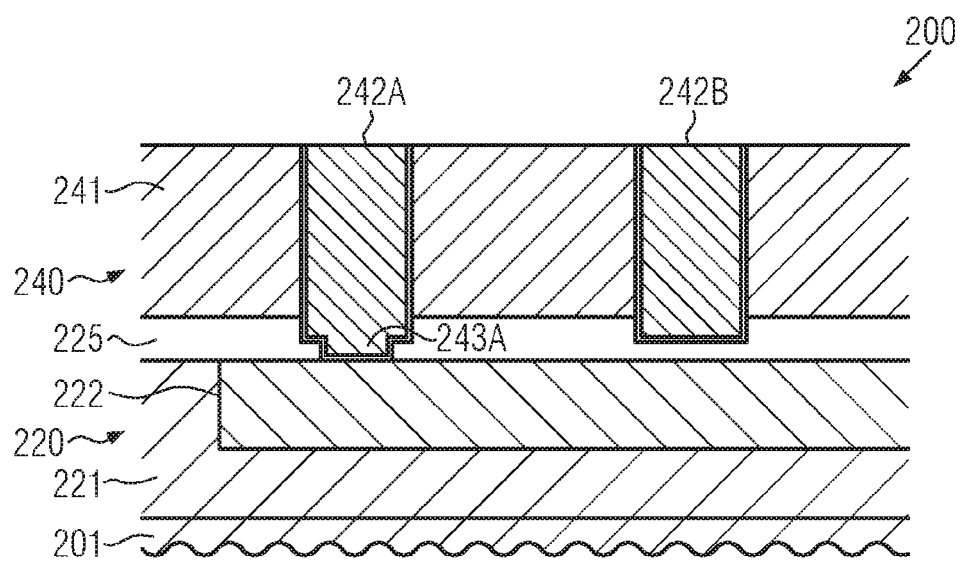
FIG. 6 shows a cross-sectional view of a semiconductor device comprising two metallization layers and metal lines.

FIGS. 5 and 6 illustrate metal lines that might be formed based on the layouts shown in FIGS. 1a-2d. As shown in FIG. 5, according to an exemplary configuration, a metallization layer 100 comprises an interlayer dielectric (ILD) 102 wherein trenches have been formed. A barrier layer 104 has been formed over the ILD 102. A metal line layer 108, for example, comprising or consisting of copper, has been formed over the barrier layer 104, for example, by electroplating or electroless plating, followed by chemical mechanical polishing performed to remove excessive material.

The barrier layer 104 may comprise, for example, tantalum nitride, tantalum, titanium nitride, titanium-tungsten, tungsten, tungsten nitride, titanium silicon nitride, silicon nitride, cobalt or ruthenium, etc. The barrier layer 104 may be formed by performing a physical vapor deposition (PVD) process, an atomic layer deposition (ALD) process, a chemical vapor deposition (CVD) process or plasma-enhanced versions of such processes. In some applications, ruthenium or a ruthenium alloy may be employed on top of the barrier layer material because it bonds strongly with copper metal, which may improve the device's electromigration resistance. Cobalt or a cobalt alloy may also be employed as a part of the barrier layer material since it also tends to bond very well with copper metal. The metal layer 108 may be representative of any type of a conductive copper structure, of any desired shape, depth or configuration. For example, the metal layer 108 may extend to an underlying conductive structure through a via (not shown in FIG. 5).

Another example for advanced structures of metal lines that might be formed in an integrated circuit or semiconductor device based on the layouts shown in FIGS. 1a-2d is illustrated in FIG. 6. FIG. 6 illustrates a cross-sectional view of a semiconductor device 200 comprising a substrate 201 and a first metallization layer 220 formed above the substrate 201. The substrate 201 may represent any appropriate carrier material for forming therein and thereabove respective circuit elements, such as transistors, capacitors and the like. For example, the substrate 201 may comprise a silicon-based material, an upper portion of which may represent a semiconductor layer for forming therein and thereabove semiconductor elements, as required by the circuit layout under consideration. In other cases, the substrate 201 may represent an insulating material, in combination with an appropriate semiconductor layer, thereby establishing an SOI-like (semiconductor-on-insulator) configuration, wherein the SOI-like configuration, however, may be provided only partially across the substrate 201, depending on the specific requirements for the circuit elements under consideration.

The first metallization layer 220 may be formed over a variety of integrated circuit devices, such as transistor devices, capacitor devices, resistor devices, RAM cells, etc. The first metallization layer 220 represents the first metallization layer in the sense that the layer 220 is the first wiring level of the device 200 above the device layer, wherein respective vertical contacts (not shown) may establish an electrical connection to one or more metal lines 222, which may be formed within a dielectric material 221 of the first metallization layer 220. Alternatively, the first metallization layer 220 may represent any metallization level below and above which one or more metallization layers may be located. The dielectric material 221 of the layer 220 may be provided in the form of any suitable dielectric material, which may comprise, in sophisticated applications, a low-k dielectric material, wherein a relative permittivity of the low-k dielectric material may be 3.0 or less, or the dielectric material 221 may be comprised of silicon dioxide, silicon oxynitride or silicon nitride. The metal line 222 may comprise as a main component a highly conductive metal, such as copper, copper alloys, silver, silver alloys, aluminum and the like. Furthermore, the metal line 222 may comprise an appropriate barrier material (such as the barrier layer 104 illustrated in FIG. 5) so as to confine the main component of the highly conductive metal in order to suppress undue out-diffusion of metal atoms into the surrounding dielectric material 221.

The metal line 222 may have a length direction (horizontal direction in FIG. 6), and may also have a width direction (direction perpendicular to the drawing plane of FIG. 6). In complex integrated circuits, respective metal lines, such as the metal line 222, may be formed such that these lines extend substantially in parallel, while metal lines of a vertically adjacent metallization layer may also substantially extend in parallel within the vertically adjacent metallization layer, but they extend in a length direction that is perpendicular to the length direction of the first metallization layer 220. In this context, any positional statements given herein should be considered as "relative" positional information, wherein the substrate 201 or a respective surface or interface thereof may act as a reference. Hence, a "vertical" direction may be considered as a direction of a surface normal of the substrate 201 while a "horizontal" direction may represent a lateral direction parallel to a respective surface or interface defined by the substrate 201. In this sense, the first metallization layer 220 is formed "above" the substrate 201, and a cap layer 225, representing a portion of the first metallization layer 220, is formed "above" the dielectric material 221 and the metal line 222.

The cap layer 225 may be comprised of any appropriate dielectric material, which, in some illustrative embodiments, may provide a reliable confinement of the metal line 222 while also acting as an efficient etch stop layer during the patterning of a dielectric material of a metallization layer to be formed above the layer 220. In some illustrative embodiments, the cap layer 225 may be comprised of a material having a moderately low permittivity, such as silicon carbide, nitrogen-containing silicon carbide, silicon dioxide, silicon oxynitride and the like.

As shown in FIG. 6, the semiconductor device 200 furthermore comprises a second metallization layer 240 comprising another dielectric material 241 that may comprise one of the materials that are described above with reference to the dielectric material 221 of the first metallization layer 220. The second metallization layer 240 shown in FIG. 6 may be the third, fourth, etc. metallization layer of the semiconductor device 200. Metal lines 242A and 242B may be formed in the second metallization layer 240. The metal lines 242A and 242B may comprise or consist of copper. A via 243A may connect the metal line 242A with the metal line 222, while the metal line 242B may be separated and thus electrically insulated from the metal line 222 by the remaining portion of the cap layer 225. The metal lines 242A and 242B may be metal lines formed according to the layouts illustrated in FIGS. 1a-2d. Note that the cross-sectional view of the metal lines 242A, 242B in FIG. 6 depicts the width direction of the metal lines 242A, 242B. Also note that the metal lines 242A, 242B in the second metallization layer 240 are positioned substantially parallel to one another within the second metallization layer 240 and that the length direction (i.e., a direction perpendicular to the drawing plane of FIG. 6) of the metal lines 242A, 242B is substantially perpendicular to the length direction of the metal line 222.

FIG. 1a shows metal lines M (hatched structures) and vias Vd connecting to a lower metallization layer and vias Vu connecting to an upper metallization layer of a provided layout that are to be formed in a metallization layer. According to an exemplary method, semi-isolation configurations are identified for this layout. A semi-isolation configuration indicated by solid rectangles S adjacent to corresponding (portions of) metal lines M are characterized in that there is no neighbored metal line (portion) M with a distance below a predetermined (isolation) distance. For example, in one embodiment, the predetermined (isolation) distance may be about 1.5 or 2 times the width of a (portion of a) metal line under consideration. In this case, a semi-isolation configuration (situation) is determined to exist if a portion of a first one of the metal lines M has no neighbored portion of a second metal line that is within a distance that is less than the predetermined (isolation) distance, e.g., a distance of less than 1.5 or 2 times, respectively, of the width of the first metal line of the layout.

After identifying all of the semi-isolation configurations that exist in the layout, the involved metal lines are shifted or moved within the layout and elongated to maintain electrical contact between shifted Ms and non-shifted portions of the metal lines M to obtain an improved layout (with respect to critical distances of closely neighbored metal lines) as shown in FIG. 1b. Widths of shifted portions Ms of the metal lines may also be changed if considered appropriate. In particular, the widths of the shifted portions Ms of the metal lines may be increased to increase current transport capabilities. It is to be understood that, in this description, a shift of a metal line may comprise the shift of a finite semi-isolated portion of a metal line (portion of a semi-isolated metal line) only. The individually shifted (portions of) metal lines Ms are indicated by the solid rectangles. Non-shifted (portions of) metal lines are indicated by M in FIG. 1b. It goes without saying that electrical connections of shifted Ms and non-shifted portions M of metal lines have to be preserved. Moreover, it has to be observed that portions of metal lines comprising vias Vu, Vd should not be shifted. This can be guaranteed by considering the locations of vias during the process of determining or identifying the existence or presence of the semi-isolation configurations in the layout, i.e., by neglecting portions of metal lines comprising vias Vu, Vd during the determination process, for example.

In the example shown in FIG. 1b, a predetermined (isolation) distance of 2 times the width of a (portion of a) metal line M under consideration is chosen and a shift of a semi-isolated (portion of) metal line M by 0.25 of the width of the shifted (portion of the) metal line Ms is performed if the space between the (portion of the) metal line and another metal line is at least 2 times the width of the shifted (portion of the) metal line but below 3 times the width of the shifted (portion of the) metal line. In another example, a shift of a semi-isolated (portion of) metal line by 0.5 of the width of the shifted (portion of the) metal line Ms is performed if the interspace between the (portion of the) metal line and another metal line is at least 3 times the width of the shifted (portion of the) metal line but below 4 times the width of the shifted (portion of the) metal line. In yet another example, a shift of a semi-isolated (portion of) metal line by the width of the shifted (portion of the) metal line is performed if the interspace between the (portion of the) metal line and another metal line is at least 4 times the width of the shifted (portion of the) metal line. As illustrated in FIG. 1b, shifted portions Ms of metal lines may be extended in the layout in order to preserve electrical connections.

Of course, the numbers given in the description of FIGS. 1a and 1b are given for exemplary purposes only.

Figure 2A:
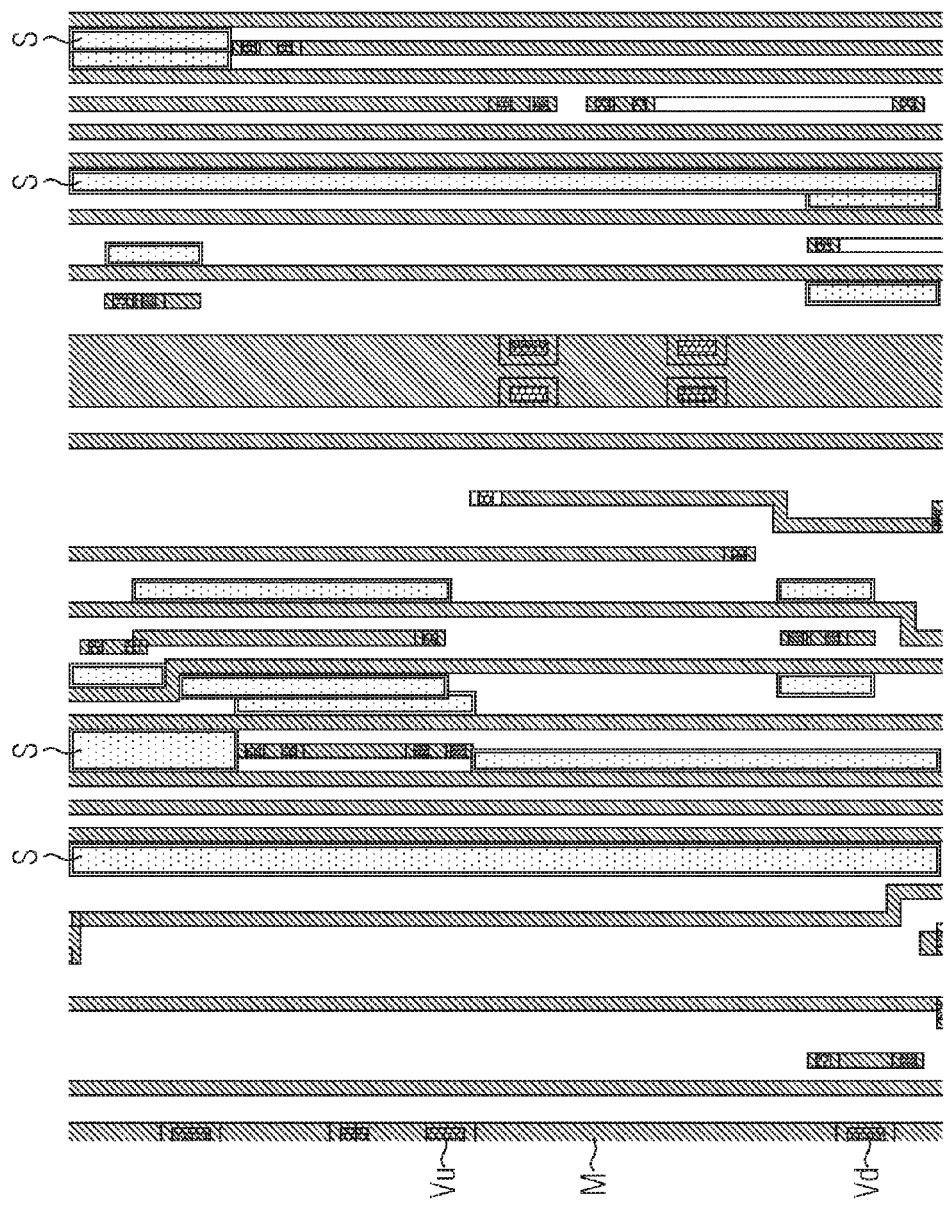
FIGS. 2a-2d illustrate examples of layouts based on metal line shifting.
Figure 2B:
Figure 2C:
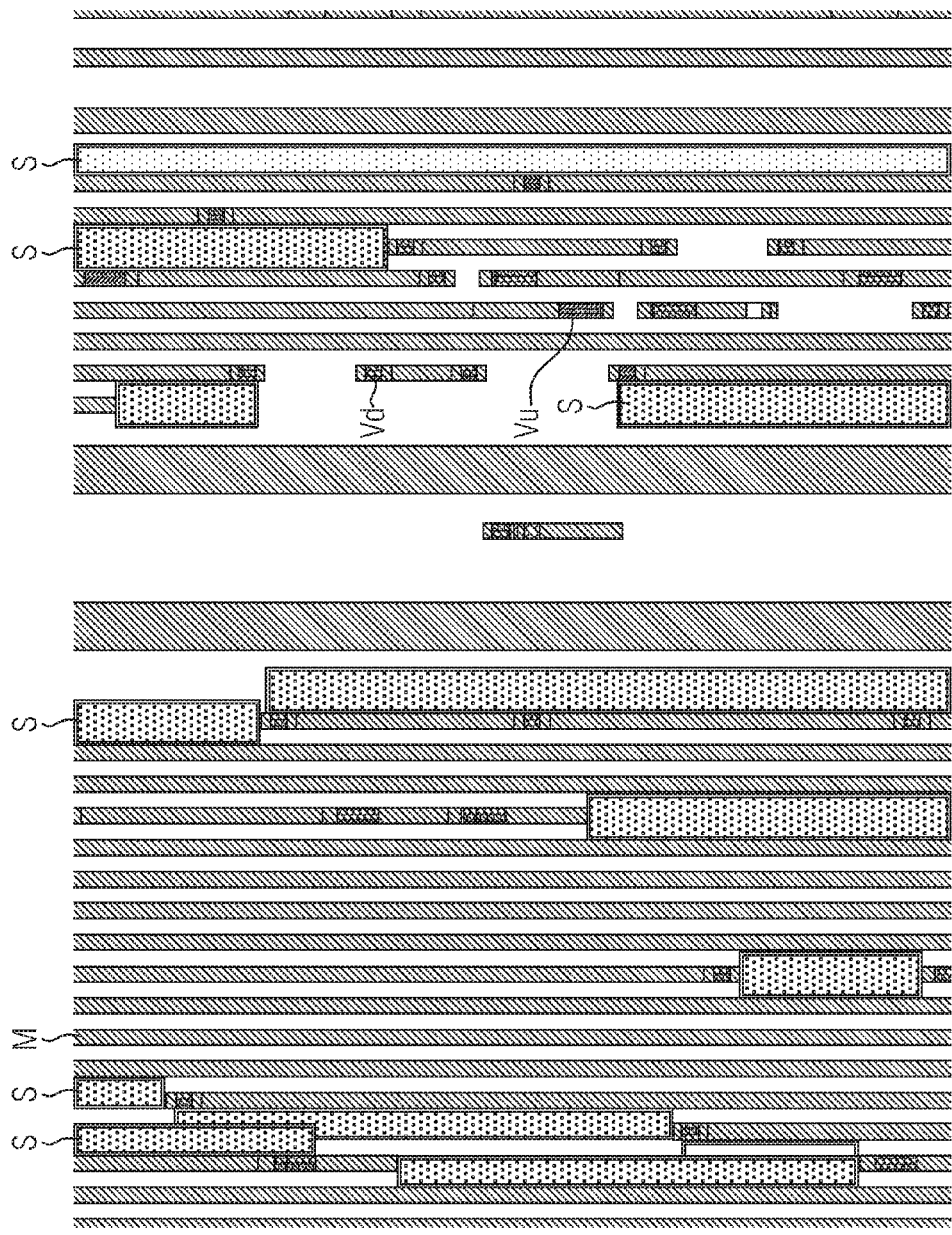
Figure 2D:
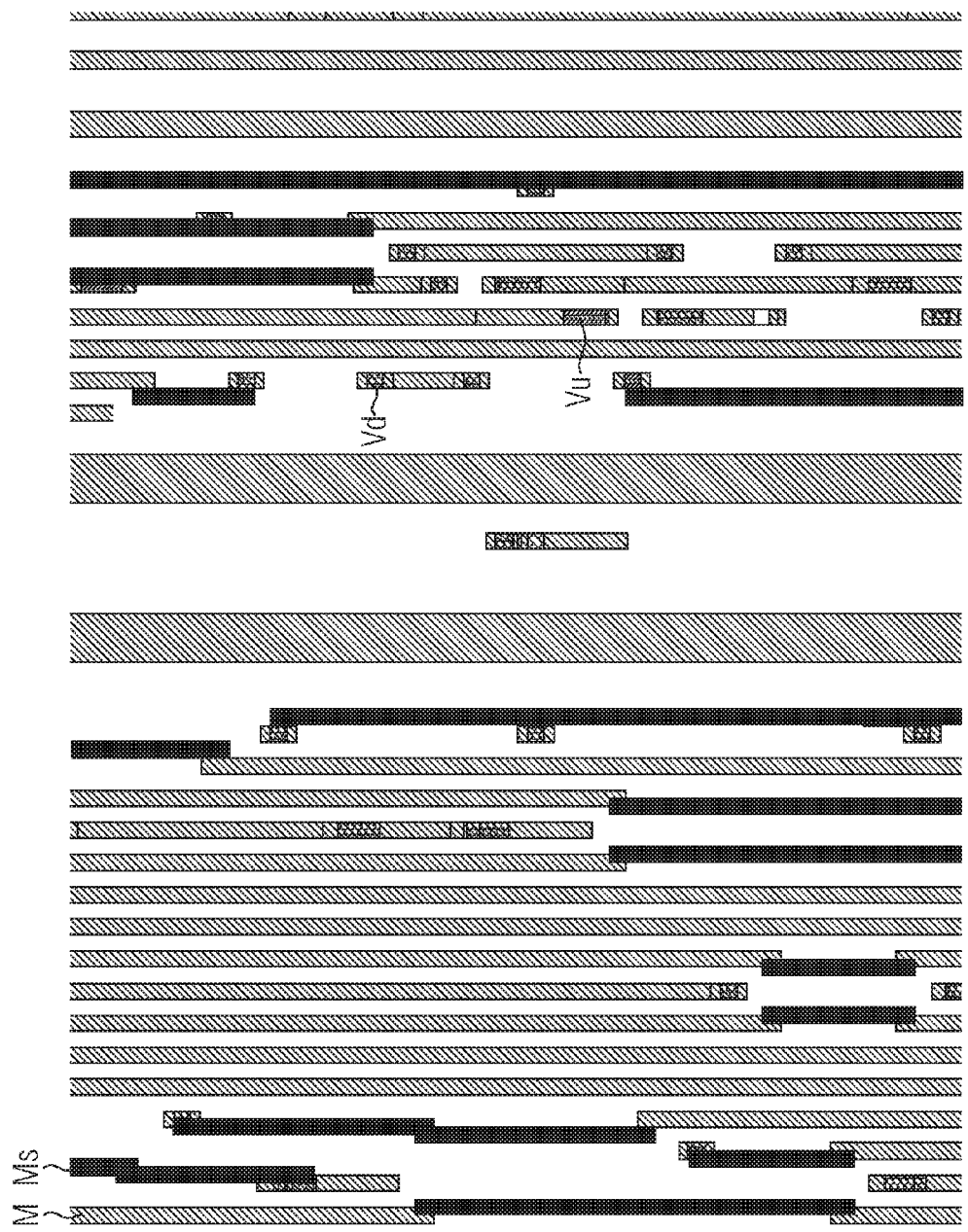

Another example of the herein disclosed method of layouts based on metal line shifts is illustrated in FIGS. 2a and 2b and 2c and 2d, respectively, for a layout configuration different from the one shown in FIGS. 1 and 1b. Again, a conventionally provided layout may be a starting point and semi-isolation configurations S are detected adjacent to the metal lines M as shown in FIGS. 2a and 2c. Based on the determined semi-isolation configurations, metal line shifting is performed as shown in FIGS. 2b (for the configuration shown in FIGS. 2a) and 2d (for the configuration shown in FIG. 2c), respectively.

In all of the above-described examples, due to the shifted metal line approach, the above-described problems raised by densely packed metal lines may be avoided. The distances of (portions of) metal lines to their closest neighbors may be significantly increased. Particularly, the shifted (portions of) metal lines predetermined (isolation) distance may be formed with larger line width than before shifting due to (and governed by) the space available.

An exemplary method of generating a layout for metal lines based on line shifting is now described with reference to the flow chart shown in FIG. 3. A conventionally obtained layout for metal lines of a metallization layer is provided and semi-isolated metal lines are detected 301.

A metal line or a portion thereof may be determined or identified to be a semi-isolated metal line if that metal line is separated from a neighbored portion of another metal line by a distance exceeding a predetermined minimum spacing that is considered appropriate for the structures. Before or after the process 301 is performed, the metal line at issue is checked for the existence of any vias Vu, Vd, as indicated in block 302, that may contact the metal line at issue, as the existence of such vias has to be taken into account in the metal line shifting process because the locations of the vias cannot be changed in the adaptation of the previously provided layout during the line shifting. After checking for vias, as indicated in block 302, a check or investigation is made as to the availability of unoccupied space for the line shifting process of the metal line that is identified to be a semi-isolated metal line, as reflected in block 303.

Based on the detected semi-isolated metal line (block 301), the checked vias (block 302) and the determined available space (block 303), the next operation involves determining a shift window for shifting the identified semi-isolated metal line, as indicated in step 304. Using the defined shift window (block 304), the identified (portion of the) semi-isolated metal line is shifted, as indicated in block 305, taking into account the available space as determined in block 303. The spatial shifting (displacement) may be performed based on read design patterns of metal configurations stored in a pattern catalog. Examples for such patterns that can be used for pattern matching in order to perform the metal line shifting are illustrated in FIGS. 4a-4f. The numbers shown in these figures denote dimensions in units of nm. These numbers are given for exemplary purposes only.

Figure 4A:
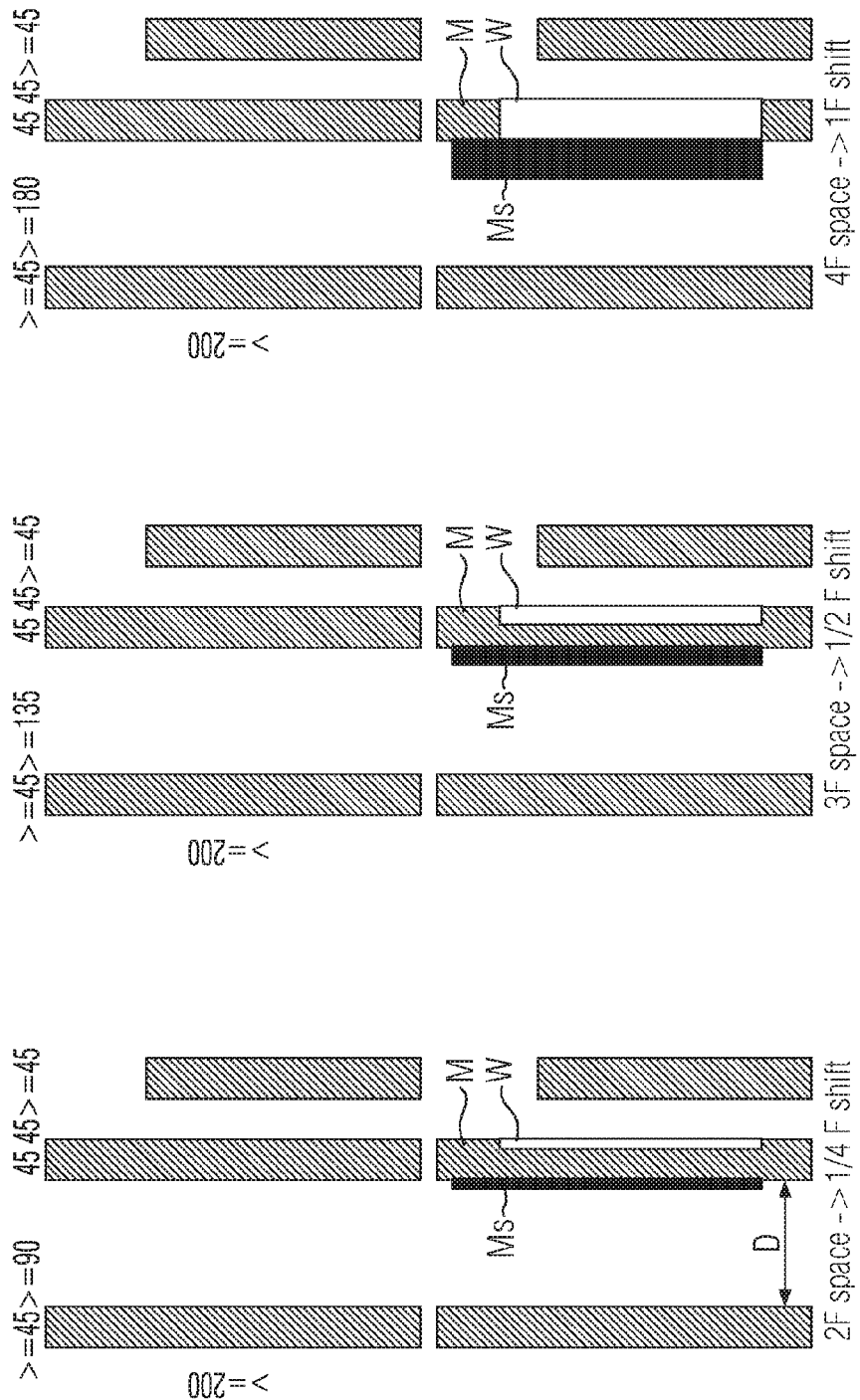
FIGS. 4a-4f show typical patterns stored in a pattern catalog that can be used for the line shifting procedures illustrated in FIGS. 1a-2d and described with reference to FIG. 3.
Figure 4B:
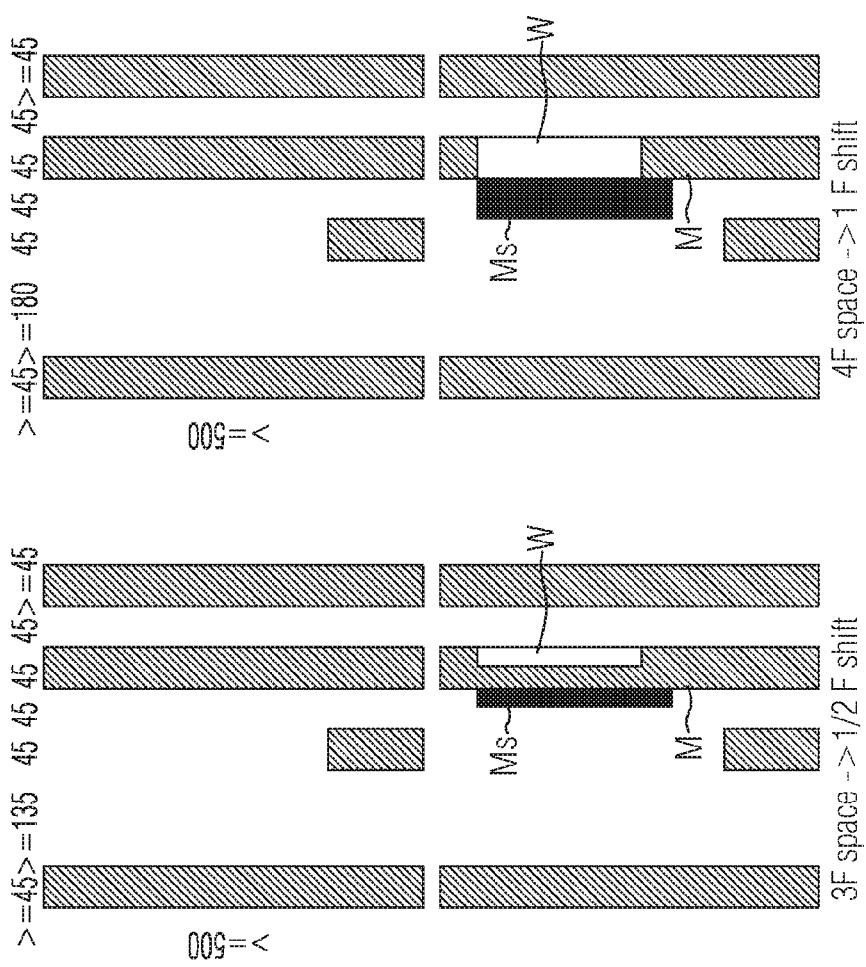

FIG. 4a shows a simple shifting (displacement) of a portion of a semi-isolated metal line M. On the left side of FIG. 4a, a shift of a portion of a semi-isolated metal line by a quarter of the width (F) of the metal line M is shown. The shifted portion is indicated by Ms. The middle row of FIG. 4b illustrates a shift by half of the width of the metal line M and the right side shows a shift by the width of the metal line M. Again, the lengths of the shifted portions may be varied. In the regions W, no metal material will be printed after the shifting process. In all cases, the shifted portion Ms may be extended in the longitudinal direction of the metal line (direction from bottom to top in FIG. 4a). The degree of shifting may particularly depend on the available space, i.e., the interspace D between neighbored metal lines M under consideration. FIG. 4b illustrates a similar case for shifting a portion of a determined semi-isolated metal line M of a dense pattern (the left side shows a shift by half of the width of the semi-isolated metal line M and the right side shows a shift by the width of the semi-isolated metal line M).

Figure 4C:
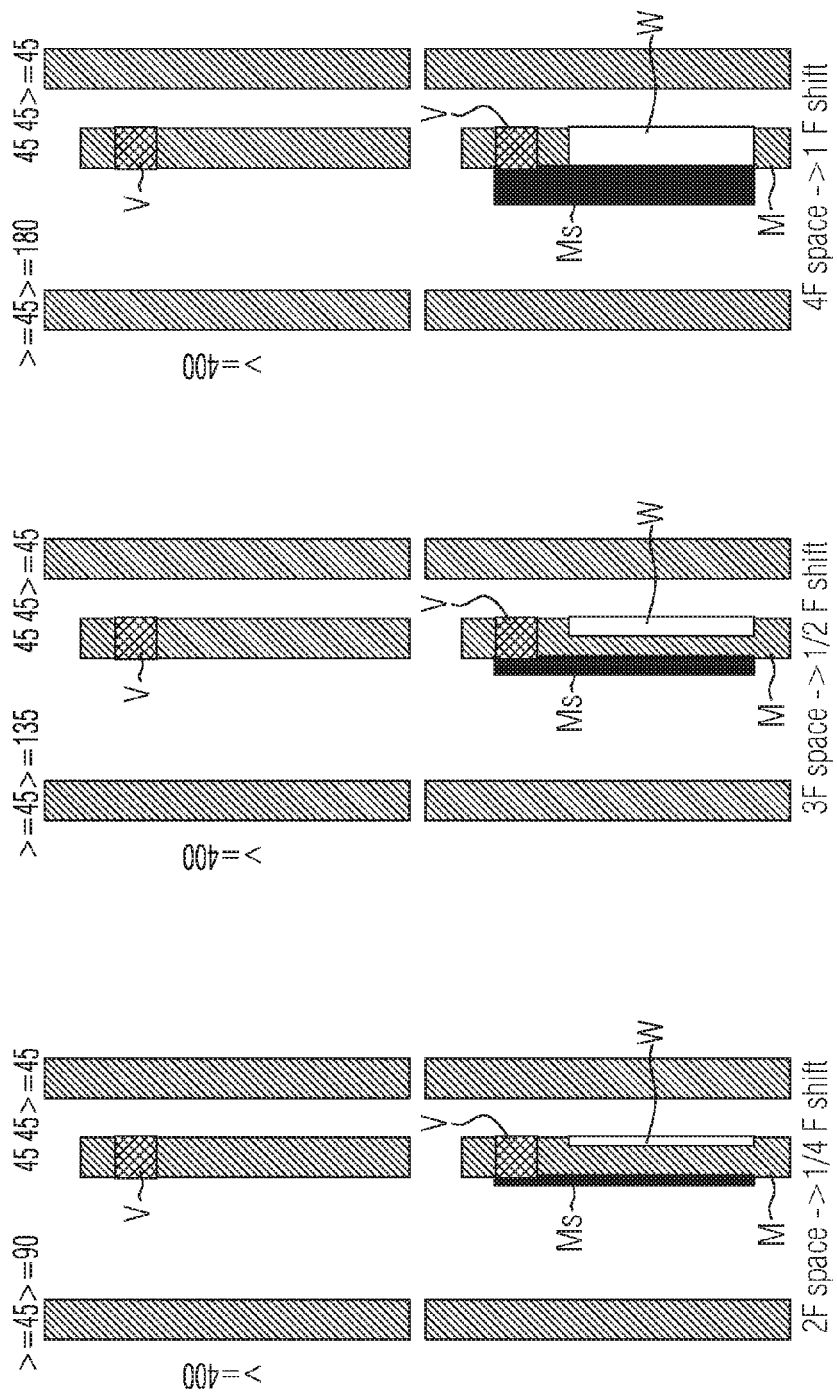

FIG. 4c illustrates a case for shifting a portion of a determined semi-isolated metal line M taking into account the location of a via V. On the left side of FIG. 4c, a shift of a portion of a semi-isolated metal line by a quarter of the width of the metal line is shown. The shifted portion is denoted by Ms. The middle row of FIG. 4c illustrates a shift by half of the width of the metal line M and the right side shows a shift by the width of the metal line M. As shown in FIG. 4c, no portion comprising a via V is shifted in order to maintain electrical connections between the metal lines in the shown metallization layer and conductive structures below or above this metallization layer.

Figure 4D:
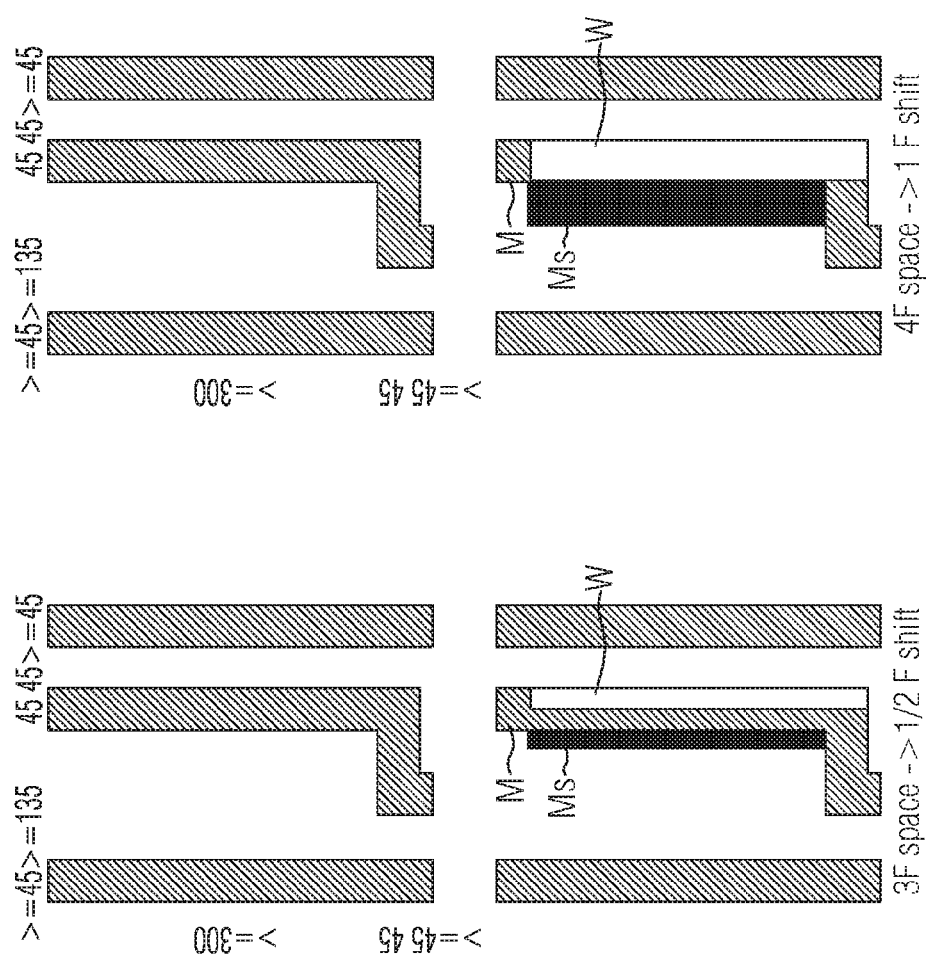
Figure 4E:
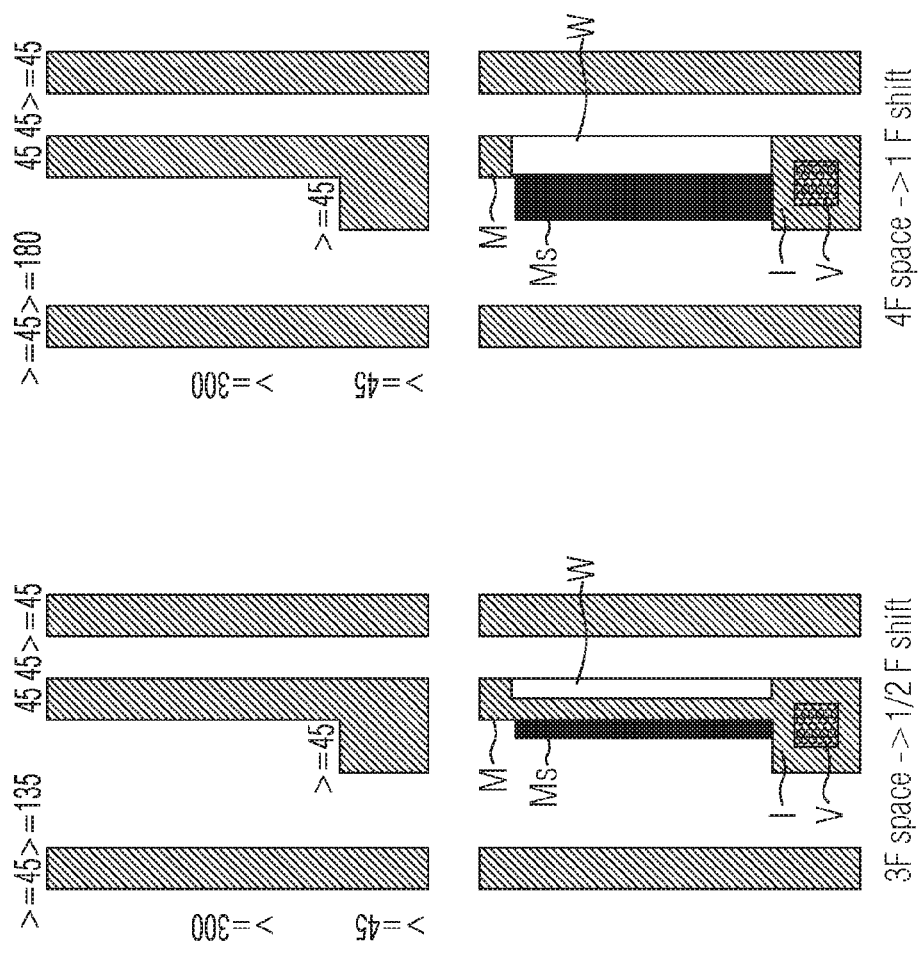
Figure 4F:
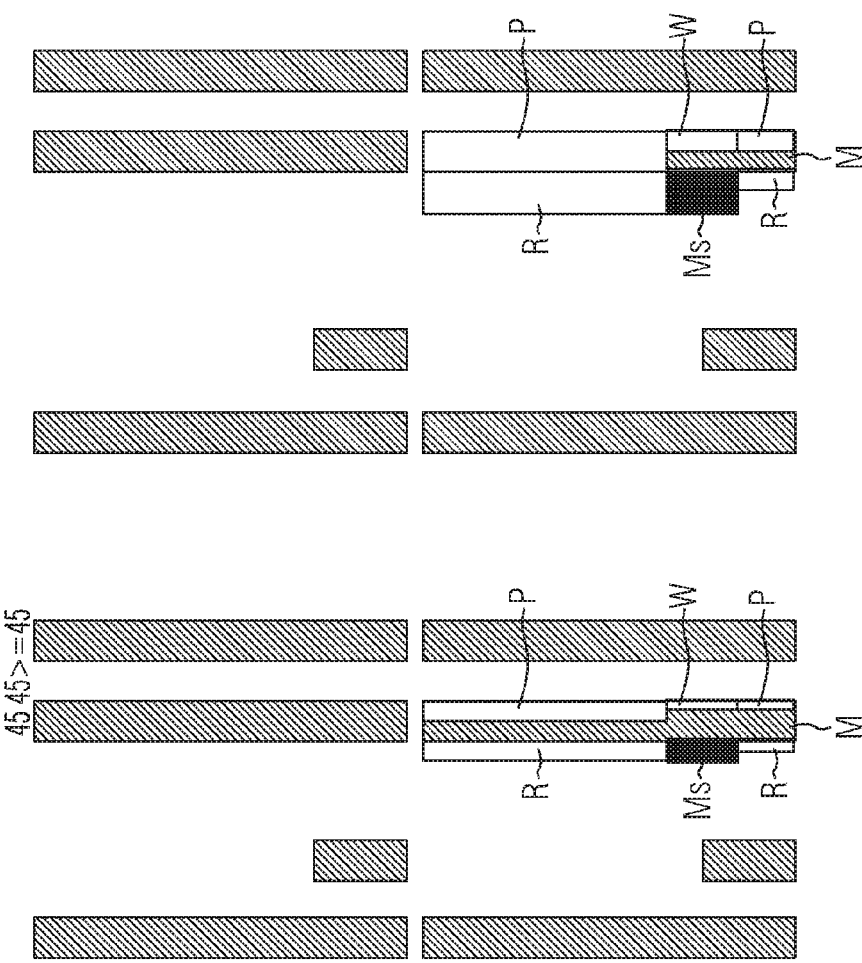

FIG. 4d illustrates a case for shifting a portion of a determined semi-isolated metal line M having an L-hook configuration (the left side shows a shift by half of the width of the semi-isolated metal line M and the right side shows a shift by the width of the semi-isolated metal line M). FIG. 4e illustrates a case for shifting a portion of a determined semi-isolated metal line M in a configuration including a relatively large island I that may comprise a via V. The left side of FIG. 4e shows a shift by half of the width of the semi-isolated metal line M and the right side shows a shift by the width of the semi-isolated metal line M. FIG. 4f illustrates a case for shifting a portion of a determined semi-isolated metal line M in a configuration wherein some fine tuning is needed (the left side shows a shift by half of the width of the semi-isolated metal line M and the right side shows a shift by the width of the semi-isolated metal line M). The regions indicated by R are, in principle, available for portions P of the semi-isolated metal line M that could be shifted according to a criterion based on available interspace between neighbored metal lines. However, shifting of the portions P may not be considered appropriate in view of any design constraints different from the available space but considered for a fine tuning process.

Figure 3:
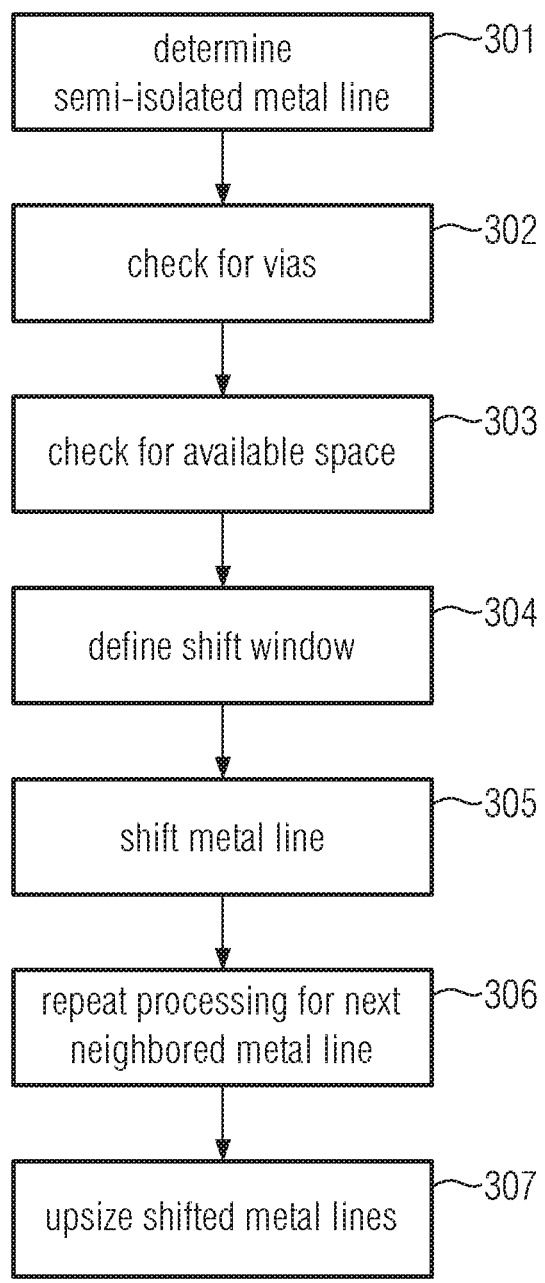
FIG. 3 shows a flow chart illustrating an example of the herein disclosed method of generating a layout based on line shifting.

The shifting process 305 of FIG. 3 may, alternatively, be performed in a rule-based manner rather than a pattern-based manner. In this case, a set of rules that inter alia may define the presence of vias and metal line portions of integrated circuits may be read and used for the shifting process 305.

The above-described steps 301 to 305 of the process flow illustrated in FIG. 3 may be repeated for the next neighbor of the semi-isolated metal line, as indicated in block 306. All identified semi-isolated metal lines of the entire layout may be shifted. In addition, some or all of the shifted metal lines may be upsized or increased in size, as indicated in block 307. In particular, shifted portions of semi-isolated metal lines may be extended in the longitudinal direction and they may be enlarged in a width direction or they may be enlarged in both the length and width directions. OPC techniques may be employed in the upsizing process. Based on the thus generated revised and improved layout, physical metal lines of a metallization layer may be formed.

The above-described examples of the herein disclosed methods may be implemented in computer systems. The computer system may particularly include a pattern library for storing patterns, for example the ones illustrated in FIGS. 4a-4f. The computer system may further include a layout construction tool for generating a layout based on provided design data of an integrated circuit, a pattern matching tool for reading patterns from the pattern library and a layout modification tool for generating a layout with shifted metal lines. The design data may include circuit features, for example, metal lines formed of an electrically conductive metal and vias filled with the electrically conductive metal that can provide electrical connections between metal lines in different interconnect layers. The layout construction tool may provide a layout of an integrated circuit in a conventional file format used for layout data such as GDSII or OASIS.

The computer system may include one or more conventional computers, each including a processor, a volatile memory and non-volatile memory. The computer system may be connected to a computer network. The layout construction tool, the pattern matching tool and the layout modification tool may be provided in the form of code that may be executed by one or more processors of the computer system. Codes for causing a computer to function as the layout construction tool, the pattern matching tool, and the layout modification tool may be stored on and provided to the computer system by means of conventional storage media such as hard disks, solid state disks, memory cards, CDs and DVDs.

As a result, the present disclosure provides techniques for BEOL in the context of the manufacturing of integrated circuits wherein layouts are provided for metal lines of metallization layers based on metal line shifting of semi-isolated (portions of) metal lines. Consequently, semi-isolated (portions of) metal lines may be formed with larger distances from the next neighbors and with increased widths. Thereby, copper or other materials used for the formation of metal lines may be reliably formed while avoiding increased resistances and capacitive couplings that pose severe problems in the conventional manufacturing process based on layouts of the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    providing a layout for metal lines of a metallization layer of a semiconductor device;
    identifying a metal line in said layout as being a semi-isolated metal line;
    determining a first portion of said identified semi-isolated metal line that is directly connected to a via formed in said metallization layer;
    shifting at least a second portion of said identified semi-isolated metal line within said layout, wherein said shifting of at least said second portion of said identified semi-isolated metal line excludes said first portion of said identified semi-isolated metal line that is determined to be directly connected to said via; and
    fabricating said semiconductor device based on said layout after said shifting.

2. The method of claim 1, further comprising increasing at least one of a width and a length of said shifted at least a second portion of said identified semi-isolated metal line.

3. The method of claim 1, wherein said identified semi-isolated metal line is neighbored to another metal line and wherein a distance of said at least a second portion of said identified semi-isolated metal line to said neighbored metal line is increased by said shifting.

4. The method of claim 3, wherein said steps of identifying said metal line in said layout as being a semi-isolated metal line and shifting at least a second portion of said identified semi-isolated metal line are repeated for said neighbored metal line.

5. The method of claim 1, wherein said identified semi-isolated metal line is shifted by a predetermined distance of one of ¼, ½ and 1 times a width of said identified semi-isolated metal line.

6. The method of claim 1, wherein a metal line in said layout is identified as being a semi-isolated metal line when at least a portion of said metal line in said layout has a distance to a neighbored metal line of at least a predetermined value.

7. The method of claim 6, wherein said predetermined value is one of 2, 3 or 4 times a width of said metal line in said layout.

8. The method of claim 1, further comprising reading a pattern from a pattern catalog and wherein said shifting of said at least a second portion of said identified semi-isolated metal line is performed based on said read pattern.

9. The method of claim 1, wherein said shifting of said at least a second portion of said identified semi-isolated metal line is performed based on a design rule.

10. A method, comprising
    providing a first layout comprising a plurality of metal lines of a metallization layer of a semiconductor device;
    identifying semi-isolated metal lines within said plurality of metal lines in said first layout;
    shifting at least portions of said identified semi-isolated metal lines into available space in said first layout to generate a second layout such that said shifted portions of said identified semi-isolated metal lines are located further away from closest neighbored metal lines in said second layout than were said portions of said identified semi-isolated metal lines in said first layout prior to being shifted;
    determining portions of said identified semi-isolated metal lines that are directly connected to vias formed in said metallization layer and wherein said shifting of at least portions of said identified semi-isolated metal lines into said available space excludes portions of said identified semi-isolated metal lines that are determined to be directly connected to said vias; and
    fabricating said semiconductor device based on said layout after said shifting.

11. The method of claim 10, further comprising defining shift windows based on said identified semi-isolated metal lines, said available space and said portions of said identified semi-isolated metal lines that are determined to be directly connected to said vias and wherein said shifting of said at least portions of said identified semi-isolated metal lines into said available space is performed by means of said defined shift windows.

12. The method of claim 10, further comprising reading a pattern from a pattern catalog and wherein said shifting of said at least portions of said identified semi-isolated metal lines is performed based on said read pattern.

13. The method of claim 10, further comprising increasing at least one of a width and a length of at least some of said shifted at least portions of said identified semi-isolated metal lines by means of an optical proximity correction technique.

14. The method of claim 10, wherein metal lines of said metal lines of said first layout are determined to be semi-isolated metal lines when at least portions of said metal lines have distances to neighbored metal lines of at least a predetermined value selected from a range of 2 to 5 times a width of said metal lines.

15. The method of claim 10, wherein said at least portions of said determined semi-isolated metal lines are shifted into available space of said first layout by a predetermined value selected from a range of 0.2 to 2 times a width of said metal lines.

16. The method of claim 10, wherein said metallization layer is a second or higher metallization layer of an integrated circuit.

17. A method, comprising:
providing a layout for metal lines of a metallization layer of a semiconductor device;
identifying a metal line in said layout as being a semi-isolated metal line, wherein a metal line in said layout is identified as being a semi-isolated metal line when at least a portion of said metal line in said layout has a distance to a neighbored metal line of at least a predetermined value, and said predetermined value is one of 2, 3 or 4 times a width of said metal line in said layout;
shifting at least a portion of said identified semi-isolated metal line within said layout; and
fabricating said semiconductor device based on said layout after said shifting.

18. The method of claim 17, further comprising increasing at least one of a width and a length of said shifted at least a portion of said identified semi-isolated metal line.

19. The method of claim 17, wherein said identified semi-isolated metal line is neighbored to another metal line and wherein a distance of said at least a portion of said identified semi-isolated metal line to said neighbored metal line is increased by said shifting.

20. The method of claim 19, wherein said steps of identifying said metal line in said layout as being a semi-isolated metal line and shifting at least a portion of said identified semi-isolated metal line are repeated for said neighbored metal line.

* * * * *